(12) United States Patent
Takahashi et al.

(10) Patent No.: US 8,791,567 B2
(45) Date of Patent: Jul. 29, 2014

(54) SEMICONDUCTOR DEVICE

(75) Inventors: Nobuaki Takahashi, Kanagawa (JP);
Masahiro Komuro, Kanagawa (JP);
Satoshi Matsui, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 231 days.

(21) Appl. No.: 13/494,537

(22) Filed: Jun. 12, 2012

(65) Prior Publication Data

US 2012/0248602 A1 Oct. 4, 2012

Related U.S. Application Data

(62) Division of application No. 12/477,178, filed on Jun. 3, 2009, now Pat. No. 8,217,516.

(30) Foreign Application Priority Data

Jun. 6, 2008 (JP) .................................. 2008-149145

(51) Int. Cl.
*H01L 23/48* (2006.01)

(52) U.S. Cl.
USPC ....................................................... 257/738

(58) Field of Classification Search
CPC .......... H01L 2924/01078; H01L 2924/01079; H01L 2924/01029; H01L 2924/01013; H01L 2924/14
USPC ............................ 257/737–738, 621, 780–781
See application file for complete search history.

(56) References Cited

U.S. PATENT DOCUMENTS

| | | | |
|---|---|---|---|
| 6,590,291 B2 | 7/2003 | Akagawa | |
| 6,770,971 B2 * | 8/2004 | Kouno et al. | 257/734 |
| 6,831,367 B2 | 12/2004 | Sekine | |
| 7,071,554 B2 | 7/2006 | Hussein et al. | |
| 7,592,700 B2 | 9/2009 | Sunohara et al. | |
| 7,859,091 B2 | 12/2010 | Fujii et al. | |
| 7,884,459 B2 | 2/2011 | Yoshida et al. | |
| 8,216,934 B2 | 7/2012 | Yoshida et al. | |

(Continued)

FOREIGN PATENT DOCUMENTS

| | | |
|---|---|---|
| CN | 1722370 | 1/2006 |
| JP | 63-127550 | 5/1988 |

(Continued)

OTHER PUBLICATIONS

Chinese Patent Office issued a Chinese Office Action dated Apr. 30, 2010, Application No. 200910146024.7.

(Continued)

*Primary Examiner* — Hoa B Trinh
(74) *Attorney, Agent, or Firm* — Young & Thompson

(57) ABSTRACT

In this semiconductor device, the through-hole is formed in the substrate, and is located under the conductive pattern. The insulating layer is located at the bottom surface of the through-hole. The conductive pattern is located on one surface side of the substrate. The opening pattern is formed in the insulating layer which is located between the through-hole and the conductive pattern, where the distance $r_3$ from the circumference of the opening pattern to the central axis of the through-hole is smaller than the distance $r_1$ in the through-hole. By providing the opening pattern, the conductive pattern is exposed at the bottom surface of the through-hole. The bump is located on the back surface side of the substrate, and is formed integrally with the through-electrode.

10 Claims, 11 Drawing Sheets

(56) References Cited

U.S. PATENT DOCUMENTS

| | | | |
|---|---|---|---|
| 2005/0098891 A1* | 5/2005 | Wakabayashi et al. | 257/758 |
| 2005/0167812 A1 | 8/2005 | Yoshida et al. | |
| 2007/0257373 A1 | 11/2007 | Akram et al. | |

FOREIGN PATENT DOCUMENTS

| | | |
|---|---|---|
| JP | 08-213427 | 8/1996 |
| JP | 2004-128063 | 4/2004 |
| JP | 2005-183548 | 7/2005 |
| JP | 2005-294582 | 10/2005 |
| JP | 2006-012889 | 1/2006 |
| JP | 2007-221080 | 8/2007 |
| JP | 2008-053568 | 3/2008 |
| WO | 2004/064159 | 7/2004 |

OTHER PUBLICATIONS

Japanese Official Action—2008-149145—Mar. 19, 2013.

* cited by examiner

SEMICONDUCTOR DEVICE

CROSS REFERENCE TO RELATED APPLICATIONS

This application is a division of co-pending application Ser. No. 12/477,178 filed on Jun. 3, 2009, which claims foreign priority to Japanese Application No. 2008-149145 filed on Jun. 6, 2008. The entire content of each of these applications is hereby expressly incorporated by reference.

BACKGROUND

1. Technical Field

The present invention relates to a semiconductor device having a through-electrode and a method of manufacturing the same.

2. Related Art

In recent years, for the purpose of high integration of semiconductor elements, three-dimensional mounting of laminating semiconductor elements onto one another is carried out. In order to meet such a technique, a through-electrode is provided in the substrate of a semiconductor device. As a method of forming a through-electrode, there are techniques disclosed in Japanese Laid-open Patent Publications Nos. 63-127550, 2005-294582, and 2008-53568, for example.

The technique disclosed in Japanese Laid-open Patent Publication No. 63-127550 is such that a through-hole is formed in a GaAs substrate having an oxide film and the source electrode formed on a front surface so as to reach the source electrode, an Au film is formed in the through-hole by electron gun vapor deposition, and a through-electrode is formed by non-electrolytic plating. Here, in this technique, a back surface electrode is separately formed after the through-electrode is formed.

The technique disclosed in Japanese Laid-open Patent Publication No. 2005-294582 is such that a through-electrode with a conductive small-diameter plug and a conductive large-diameter plug is formed. The small-diameter plug is located on the front surface side of the substrate, and the large-diameter plug is located on the back surface side of the substrate. The end part of the small-diameter plug is incorporated in the large-diameter plug. Here, in this technique, the bump to be the back surface electrode is integrally formed with the large-diameter plug.

The technique disclosed in Japanese Laid-open Patent Publication No. 2008-53568 is such that a seeding layer is formed on the lower part of the side surface of the through-hole and on the bottom surface of the through-hole, and a through-electrode is formed by forming a plating layer using this seeding layer. The through-electrode and the conductive pattern formed on the insulating layer located on the front surface of the substrate are connected with each other by an electrode plug buried in the insulating layer. Here, in this technique, the bump to be the back surface electrode may be integrally formed with the through-electrode.

However, according to the technique disclosed in Japanese Laid-open Patent Publication No. 63-127550, the through-electrode and the back surface electrode are separately formed. In the technique disclosed in Japanese Laid-open Patent Publication No. 63-127550, one can conceive of integrally forming the bump and the through-electrode by continuing the non-electrolytic plating for forming the through-electrode as it is. However, by non-electrolytic plating, the plating layer grows isotropically. For this reason, when this method is adopted, the distance from the central axis of the bump to the circumference is larger by the amount of the height of the bump than that of the through-electrode, so it is needed to enlarge the pitch of the through-electrode for preventing short-circuit of the bumps. Therefore, this method cannot be adopted.

Also, according to the technique disclosed in Japanese Laid-open Patent Publication No. 2005-294582, a small-diameter plug is used as a part of the through-electrode, so it is difficult to reduce the resistance of the through-electrode. Also, according to the technique disclosed in Japanese Laid-open Patent Publication No. 2008-53568, the conductive pattern and the through-electrode are connected with each other by an electrode plug, so the resistance between them has been high.

In this manner, according to the techniques disclosed in Japanese Laid-open Patent Publications Nos. 63-127550, 2005-294582, and 2008-53568, it cannot be possible to reduce simultaneously the resistance between the conductive pattern on the insulating layer and the through-electrode, and to form integrally the through-electrode and the bump which is the back surface electrode.

SUMMARY

In one embodiment, there is provided a semiconductor device including:
a substrate;
a conductive pattern located on one surface side of the substrate;
a through-hole formed in the substrate and located under the conductive pattern;
an insulating layer located at a bottom surface on the one surface side of the through-hole;
an opening pattern formed in the insulating layer, where a distance from a circumference of the opening pattern to a central axis of the through-hole is smaller than a distance from a circumference of the through-hole to the central axis of the through-hole, so as to expose the conductive pattern to the bottom surface of the through-hole;
a through-electrode formed in the opening pattern and in the through-hole, so as to be connected to the conductive pattern; and
a bump located on a surface side opposite to the one surface side of the substrate and formed integrally with the through-electrode.

In another embodiment, there is provided a method of manufacturing a semiconductor device, including:
forming a through-hole in a substrate having a conductive pattern on one surface side from an opposite surface side thereof, so as to oppose a bottom surface of the through-hole to the conductive pattern through the intermediary of an insulating layer;
forming an opening pattern in the insulating layer, where a distance from a circumference of the opening pattern to a central axis of the through-hole is smaller than a distance from a circumference of the through-hole to the central axis of the through-hole, so as to expose the conductive pattern to a bottom part of the through-hole;
consecutively forming a through-electrode and a bump by performing non-electrolytic plating using the conductive pattern as a seeding layer, the through-electrode is located in the opening pattern and in the through-hole, and the bump is located on the opposite surface side of the substrate.

According to the present invention, the through-electrode is contact directly to the conductive pattern. Thus, the resistance between the conductive pattern and the through-electrode can be reduced. The insulating layer is located at the bottom surface on one surface side of the through-hole, but the opening pattern is formed in the insulating layer. The distance from the circumference thereof to the central axis of the through-hole is smaller than that of the through-hole. For this reason, even when the through-electrode and the bump are integrally formed, the overhang amount of the bump relative to the through-hole can be reduced. Therefore, the through-electrode and the bump can be integrally formed.

According to the present invention, it is possible to reduce simultaneously the resistance between the conductive pattern and the through-electrode and to form integrally the through-electrode and the bump.

BRIEF DESCRIPTION OF THE DRAWINGS

The above and other objects, advantages, and features of the present invention will be more apparent from the following description of certain preferred embodiments taken in conjunction with the accompanying drawings, in which.

DETAILED DESCRIPTION

Figure 1:
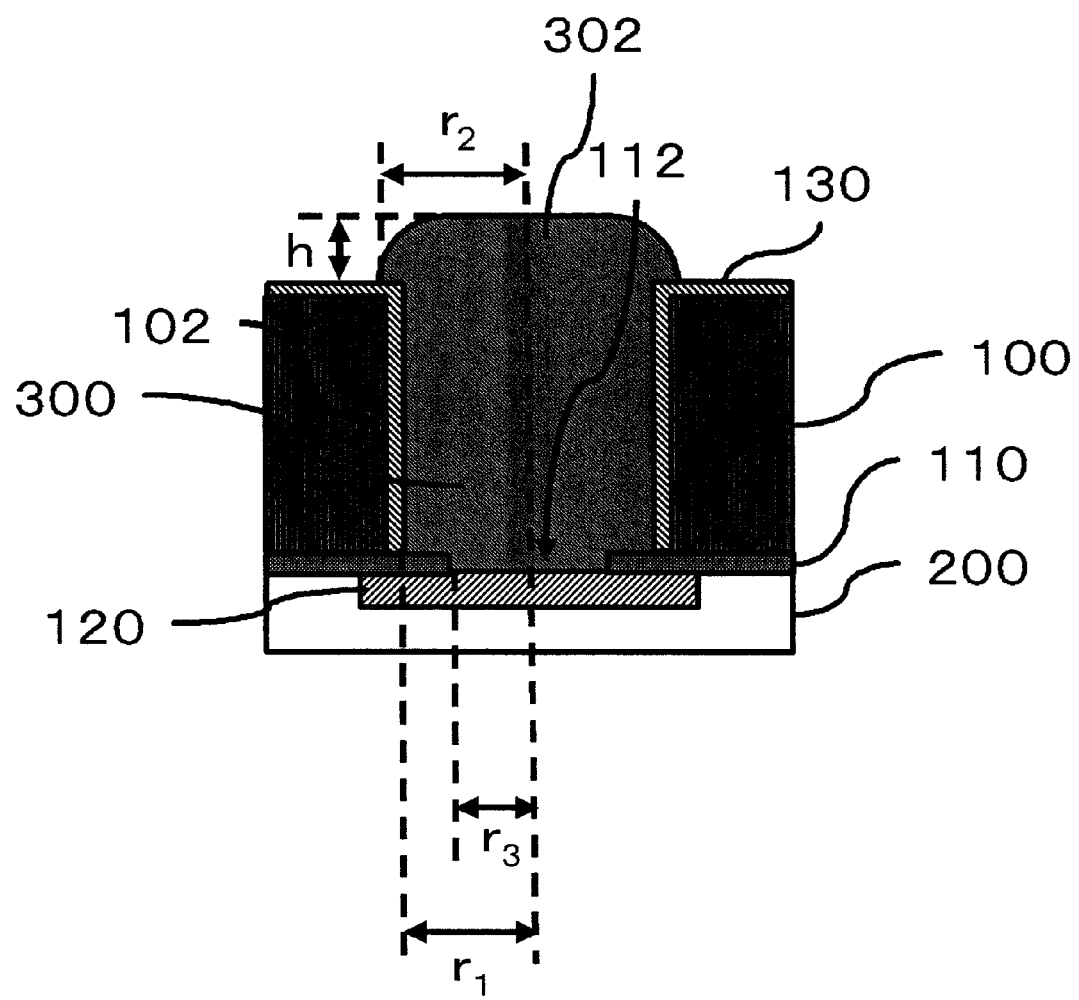
FIG. 1 is a cross-sectional view illustrating a configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereafter, the embodiments of the present invention will be described with reference to the attached drawings. Here, in all of the drawings, like constituent elements will be denoted with like reference numerals, and the description thereof will not be repeated.

First Embodiment

FIG. 1 is a cross-sectional view illustrating a configuration of a semiconductor device according to a first embodiment. This semiconductor device includes a substrate 100, a through-hole 102, a conductive pattern 120, an insulating layer 110, an opening pattern 112, a through-electrode 300, and a bump 302. The substrate 100 is, for example, a semiconductor substrate such as a silicon substrate. The through-hole 102 is formed in the substrate 100, and is located under the conductive pattern 120. In the embodiment shown in FIG. 1, the through-hole 102 has a straight shape.

The insulating layer 110 is located at the bottom surface on one surface side of the through-hole 102. In the embodiment shown in FIG. 1, the insulating layer 110 is located on the front surface (on the one surface) of the substrate 100. The insulating layer 110 is, for example, a thermal oxide film formed by thermal oxidation of the one surface of the substrate 100, or an interlayer insulating film formed on the one surface of the substrate 100 by the CVD method. The conductive pattern 120 is located on the one surface side of the substrate 100. In the embodiment shown in FIG. 1, the conductive pattern 120 located on the front surface of the insulating layer 110 is, for example, a part of an interconnect layer formed on the insulating layer 110.

The opening pattern 112 is formed in the insulating layer 110 that is located between the through-hole 102 and the conductive pattern 120, and the distance $r_3$ from the circumference of the opening pattern 112 to the central axis of the through-hole 102 is smaller than the distance $r_1$ from the circumference of the through-hole 102 to the central axis of the through-hole 102. When the cross-sectional shape (top view) of the through-hole 102 and the conductive pattern 120 is circular, this distance represents a radius. Also, when the cross-sectional shape (top view) of the through-hole 102 and the conductive pattern 120 is polygonal, $r_1$ and $r_3$ are the distances as measured along a straight line connecting the central axis and an arbitrary point (for example, an apex) on the circumference of the through-hole 102 in a top view. By providing the opening pattern 112, the conductive pattern 120 is exposed to the bottom surface of the through-hole 102.

The through-electrode 300 is formed in the opening pattern 112 and the through-hole 102, and is connected to the conductive pattern 120. The bump 302 is located on the back surface side (on the surface opposite to the one surface) of the substrate 100, and is integrally formed with the through-electrode 300.

According to this semiconductor device, the through-electrode 300 contacts directly to the conductive pattern 120. Thus, the resistance between the conductive pattern 120 and the through-electrode 300 is reduced. Also, the insulating layer 110 is located at the bottom surface on the one surface side of the through-hole 102, and the distance $r_3$ of the opening pattern 112 formed in the insulating layer 110 is smaller than the distance $r_1$ of the through-hole 102. Thus, as described later in detail, even when the through-electrode 300 and the bump 302 are integrally formed, the overhang amount $(r_2-r_1)$ of the bump 302 relative to the through-hole 102 can be reduced. Therefore, the through-electrode and the bump can be integrally formed. Here, $r_2$ is the distance from the central axis of the through-hole 102 to the circumference of the bottom surface of the bump 302. The distance $r_2$ is defined in a manner similar to $r_1$ and $r_3$ by the cross-sectional shape (top view) of the bump 302.

Figure 2A:
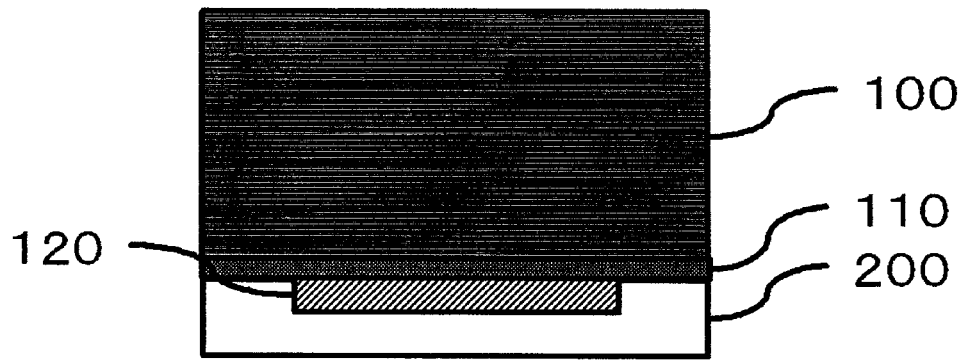
FIGS. 2A and 2B are cross-sectional views illustrating a method of manufacturing the semiconductor device shown in FIG. 1.

Next, with reference to FIGS. 2A and 2B to FIGS. 4A, 4B, and 4C, a method of manufacturing the semiconductor device shown in FIG. 1 will be described. First, as shown in FIG. 2A, an insulating layer 110 is formed on a front surface of a substrate 100 which is in a wafer state. Next, a conductive pattern 120 is formed on the insulating layer 110. The insulating layer 110 is, for example, a monolayer film selected from the group consisting of a $SiO_2$ film, a SiN film, a SiON film, and a resin material film, or is a laminate film formed by laminating films selected from this group. At least the bottom surface of the conductive pattern 120 contains one selected from the group consisting of Al, Cu, and W, or an alloy made of at least two selected from this group.

When the insulating layer 110 is a thermal oxide film of the substrate 100, the insulating layer 110 is formed, for example, by the same step of a gate insulating film of a transistor that is formed on one surface of the substrate 100. In this case, the conductive pattern 120 is formed, for example, by the same step of a gate electrode of the transistor.

When the insulating layer 110 is an interlayer insulating film, the insulating layer 110 may be an interlayer insulating film of one layer or an interlayer insulating film of a plurality of layers. Further, the conductive pattern 120 is formed by the same step as an interconnection that is located on the front surface of the insulating layer 110.

Next, a requisite layer 200 and a bump (not illustrated) are formed on the insulating layer 110 and the conductive pattern 120. This bump is electrically connected to the conductive pattern 120 by an interconnection and a contact that are not illustrated.

Next, a supporter (not illustrated) is fixed to the front surface side of the substrate 100, and the back surface of the substrate 100 is grounded, and the substrate 100 becomes thin. Here, in this step, the substrate 100 may be split into individual pieces for each semiconductor device or may be in a wafer state.

Figure 2B:
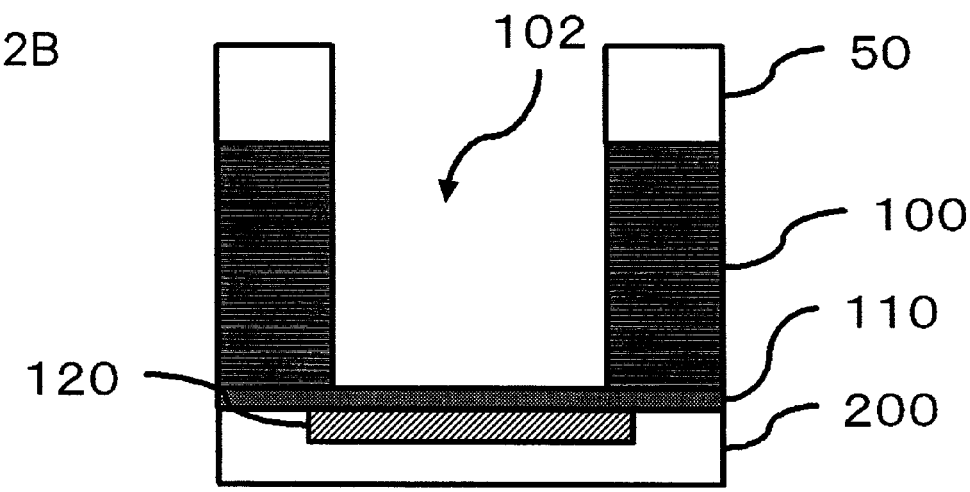

Next, as shown in FIG. 2B, a mask pattern 50 is formed on the back surface of the substrate 100. Next, with use of the mask pattern 50 as a mask, the substrate 100 is subjected to dry etching from the back surface side. By this process, a through-hole 102 is formed in the substrate 100. The insulating layer 110 is exposed to the bottom surface of the through-hole 102. The insulating layer 110 functions also as an etching stopper when the substrate 100 is etched. For this reason, the through-hole 102 does not penetrate through the insulating layer 110. The through-hole 102 is opposed to the conductive pattern 120 with the insulating layer 110 sandwiched therebetween. When the substrate 100 is viewed in a plan view, the through-hole 102 is located in the inside of the conductive pattern 120.

Figure 3A:
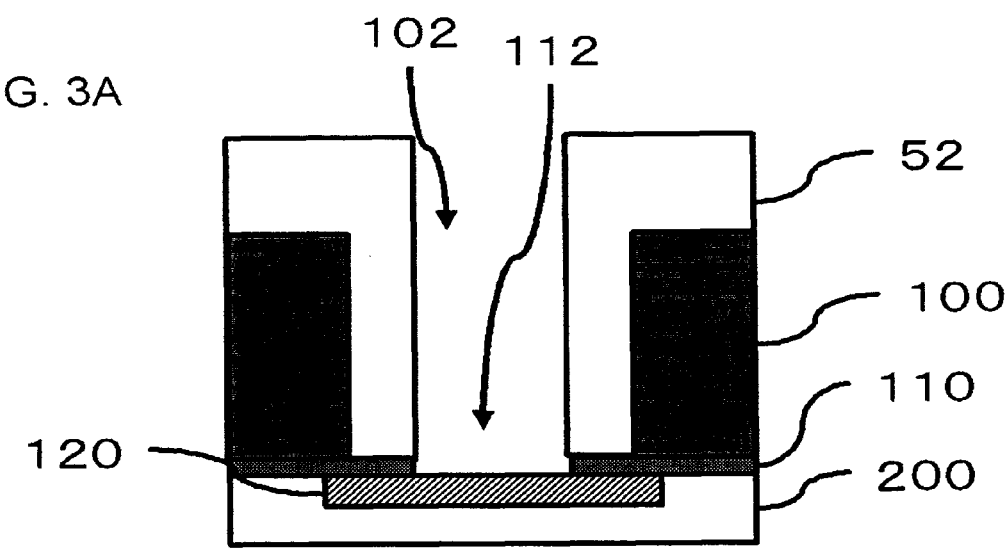
FIGS. 3A and 3B are cross-sectional views illustrating the steps subsequent to those of FIGS. 2A and 2B.

Thereafter, as shown in FIG. 3A, the mask pattern 50 is removed. Subsequently, a mask pattern 52 is formed on the back surface of the substrate 100 and on the insulating layer 110 that is exposed to the bottom surface of the through-hole 102. Next, with use of the mask pattern 52 as a mask, the insulating layer 110 is etched. This process selectively removes the insulating layer 110 so as to form an opening pattern 112 in the insulating layer 110. At the bottom surface of the through-hole 102, the insulating layer 110 remains for a certain width from the inner wall of the through-hole 102, and has a ring shape. This step exposes the conductive pattern 120 to the bottom surface of the through-hole 102.

Figure 3B:
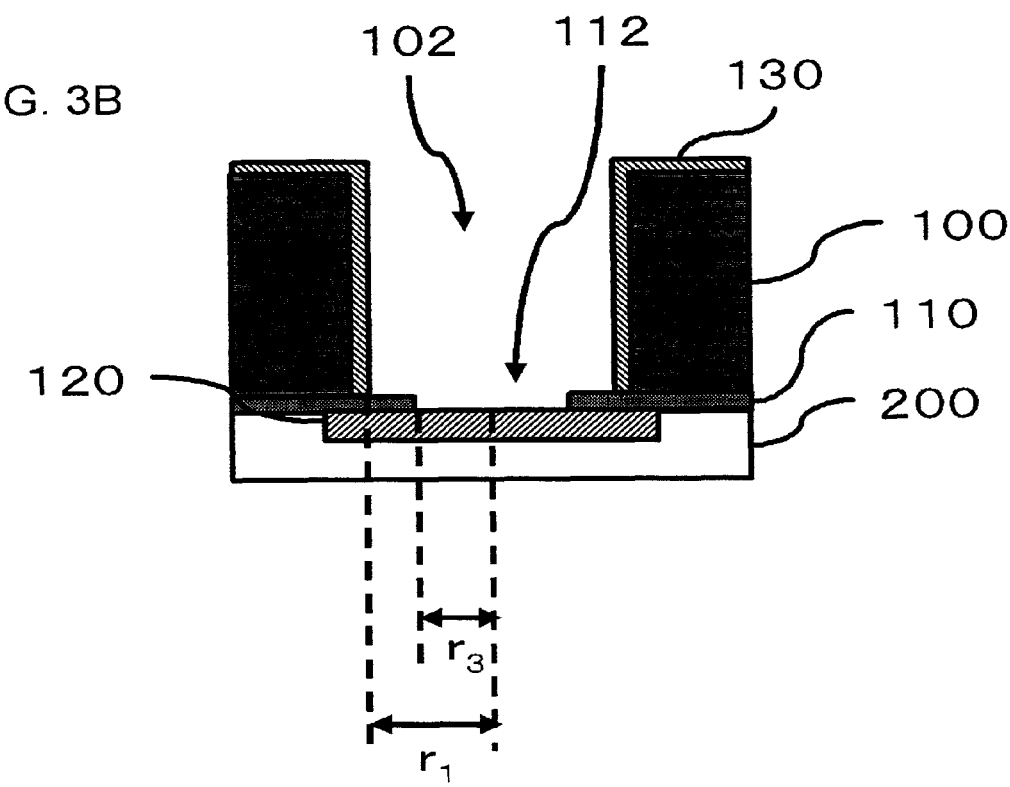

Thereafter, as shown in FIG. 3B, the mask pattern 52 is removed. Subsequently, an insulating film 130 is formed on the inner wall (side surface) of the through-hole 102 and the back surface (opposite surface) of the substrate 100. The insulating film 130 is, for example, a monolayer film selected from the group consisting of a $SiO_2$ film, a SiN film, a SiON film, and a resin material film, or is a laminate film formed by laminating films selected from this group. At this time, the insulating film 130 is formed also at the bottom surface of the through-hole 102. Next, the insulating film 130 formed at the bottom surface of the through-hole 102 is removed. When the insulating film 130 is formed from any one of a $SiO_2$ film, a SiN film, and a SiON film, the insulating film 130 is formed by the CVD method, so the insulating film 130 formed at the bottom surface of the through-hole 102 has a smaller thickness than other parts. So the insulating film 130 formed at the bottom surface of the through-hole 102 can be removed, for example, by etching-back. In this case, by repeating the step of forming the insulating film 130 and the step of etching-back for plural times, the insulating film 130 which has a desired thickness may be formed. Also, when the insulating film 130 is a resin material film and is formed by spray application, the insulating film 130 formed at the bottom surface of the through-hole 102 can be removed, for example, by etching with use of a mask pattern. Here, in the state shown in this Figure, the difference between the distance $r_3$ at the opening pattern 112 and the distance $r_1$ at the through-hole 102 ($r_1-r_3$) is, for example, 1 μm or more and 3 μm or less.

Next, a barrier film (not illustrated) is formed on the insulating film 130. The barrier film is a film that restrains the metal components of the through-electrode 300 from being diffused into the substrate 100, and is, for example, one selected from the group consisting of a TiN film, a TaN film, a TiW film, a Ti film, a Ta film, and a Cr film, or is a laminate film formed by laminating a plurality of films selected from this group.

Figure 4A:
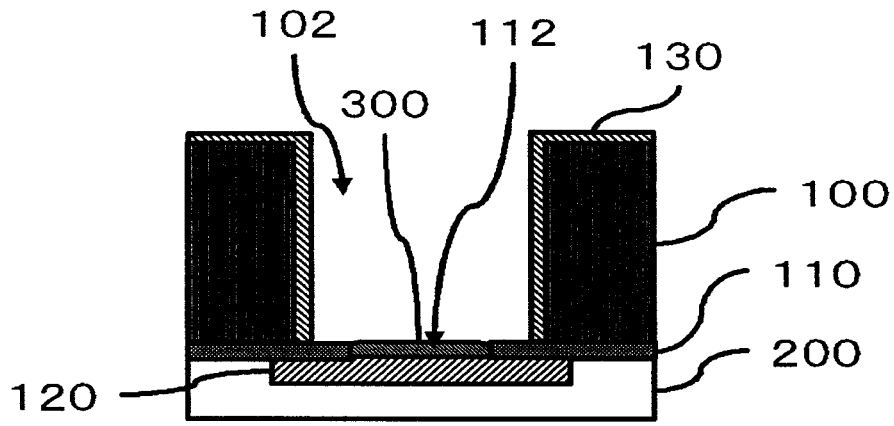
FIGS. 4A to 4C are cross-sectional views illustrating the steps subsequent to those of FIGS. 3A and 3B.
Figure 4B:
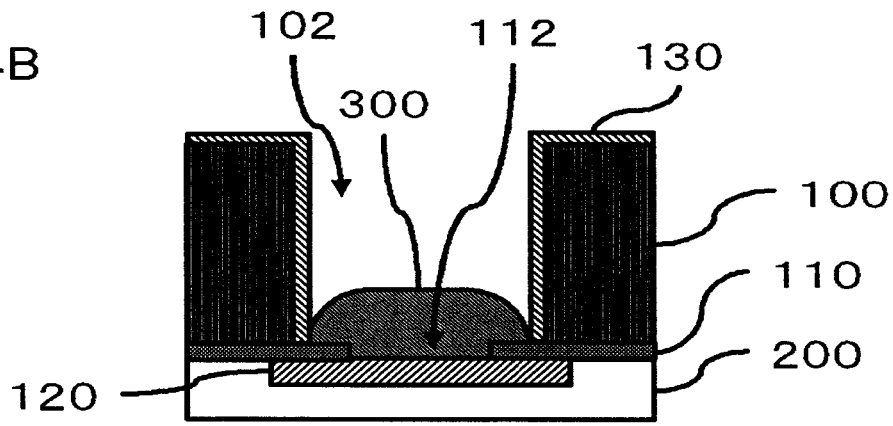

Subsequently, as shown in FIGS. 4A and 4B, non-electrolytic plating using the conductive pattern 120 as a seeding layer is performed. In this process, the through-electrode 300 gradually grows. The through-electrode 300 is a film made of one selected from the group consisting of Ni, NiP, NiB, Cu, Pd, and Au, an alloy film made of at least two selected from this group, or a laminate film formed by laminating at least two selected from this group. Here, when the conductive pattern 120 is W or a W alloy and the through-electrode 300 is Ni, a Pd catalyst treatment may be carried out on the front surface of the conductive pattern 120 which is exposed at the bottom surface of the through-hole 102 before performing the non-electrolytic plating.

In more detail, first as shown in FIG. 4A, the through-electrode 300 is formed in the opening pattern 112. Since a layer formed by non-electrolytic plating grows isotropically, a flat part having the same shape as the opening pattern 112 is formed at the top surface of the through-electrode 300 at this stage.

Thereafter, as shown in FIG. 4B, the through-electrode 300 grows isotropically upward the insulating layer 110. At this time, the flat part at the top surface of the through-electrode 300 is maintained as it is. Also, the flat part at the top surface of the through-electrode 300 will be higher than the edge of the top surface of the through-electrode 300 by an amount of the difference ($r_1-r_3$) between the distance $r_3$ at the opening pattern 112 and the distance $r_1$ at the through-hole 102.

Figure 4C:
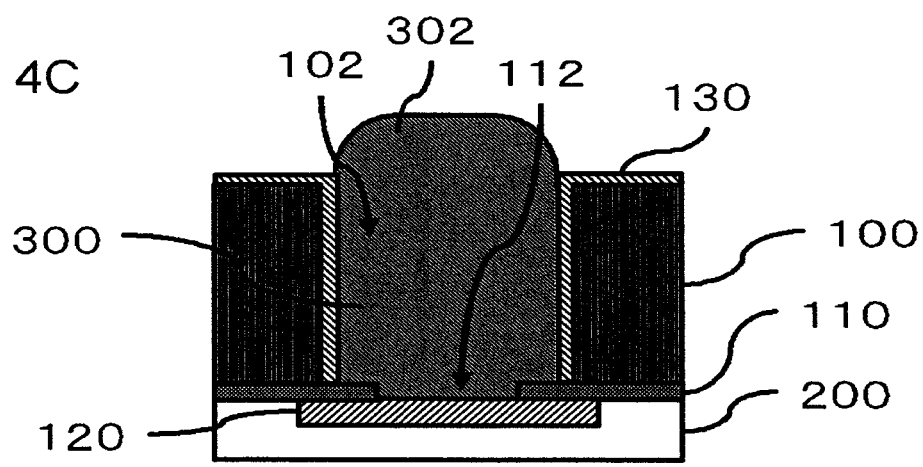

Then, as shown in FIG. 4C, as the non-electrolytic plating is continued, a part of the through-electrode 300 protrudes from the substrate 100 to become a bump 302. In this manner, the bump 302 is integrally formed with the through-electrode 300. When the edge of the top surface of the bump 302 becomes flush with the insulating film 130 which is located on the back surface of the substrate 100, the flat part at the top surface of the through-electrode 300, namely, the flat part of the top surface of the bump 302 remains higher than the edge of the top surface of the bump 302 by the amount of ($r_1-r_3$).

Thereafter, the non-electrolytic plating is continued until the bump 302 attains a desired height, so as to be in the state shown in FIG. 1. The height of the bump 302 is, for example, 1 μm or more and 30 μm or less. Here, when it is sufficient that the height of the bump 302 is ($r_1-r_3$), the non-electrolytic plating is ended in the state shown in FIG. 4C. At this time, the distance from the circumference of the bump 302 to the central axis of the through-electrode 300 is equal to the distance from the circumference of the through-electrode 300 to the central axis. Here, an Au film or a Pd film may be formed to have a small thickness on the front surface of the bump 302. Thereafter, the above-described supporter is removed, and the semiconductor devices are made into individual pieces.

Next, the functions and effects of the semiconductor device shown in the present embodiment will be described. As described above, the through-electrode 300 is in direct contact with the conductive pattern 120 located on the insulating layer 110. SO the resistance between the conductive pattern 120 and the through-electrode 300 is reduced.

Also, as described above, in the step of forming the through-electrode 300 and the bump 302 by non-electrolytic plating (FIG. 4C), when the edge of the top surface of the bump 302 is flush with the insulating film 130 located on the back surface of the substrate 100, the flat part of the top surface of the through-electrode 300, namely the flat part of the top surface of the bump 302 is higher than the edge of the top surface of the bump 302 by the amount of about $(r_1-r_3)$. So, when the non-electrolytic plating is continued so as to heighten the bump 302 further, the amount of overhang $(r_2-r_1)$ of the bump 302 relative to the through-hole 102 can be reduced by the amount obtained by adding to $(r_1-r_3)$ with an error of 30%. Therefore, even when the through-electrode 300 and the bump 302 are integrally formed, the amount of overhang of the bump 302 relative to the through-electrode 300 can be reduced. For this reason, the arrangement pitch of the through-electrodes 300 can be reduced to achieve high integration. This effect will become more conspicuous as the difference $(r_1-r_3)$ gets larger, namely, as the difference between the distance $r_3$ in the opening pattern 112 and the distance $r_1$ in the through-hole 102 gets larger.

Here, when this effect is represented by a formula, the following formula (1) is obtained.

$$(r_2-r_1)=(h-(r_1-r_3))\times(1\pm0.3) \quad (1)$$

Here, h represents the height of the bump 302.

Also, a flat part having the same shape as the opening pattern 112 is formed on the front surface of the bump 302. so there is no need to perform a treatment of flattening the front surface of the bump 302.

The effect that a flat part can be formed on the front surface of the bump 302 and the effect that the amount of overhang of the bump 302 can be reduced are in a relationship of being contradictory to each other. When there is a need to obtain these effects in good balance, it is preferable that the difference between the distance $r_3$ in the opening pattern 112 and the distance $r_1$ in the through-hole 102 is 1 μm or more and 3 μm or less.

Second Embodiment

Figure 5A:
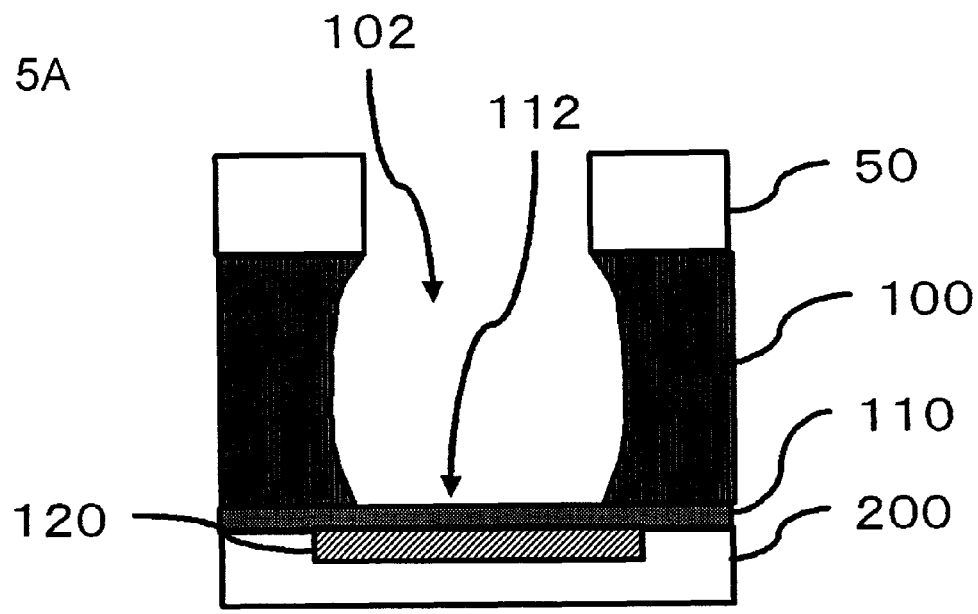
FIGS. 5A and 5B are cross-sectional views illustrating a method of manufacturing a semiconductor device according to a second embodiment.
Figure 5B:
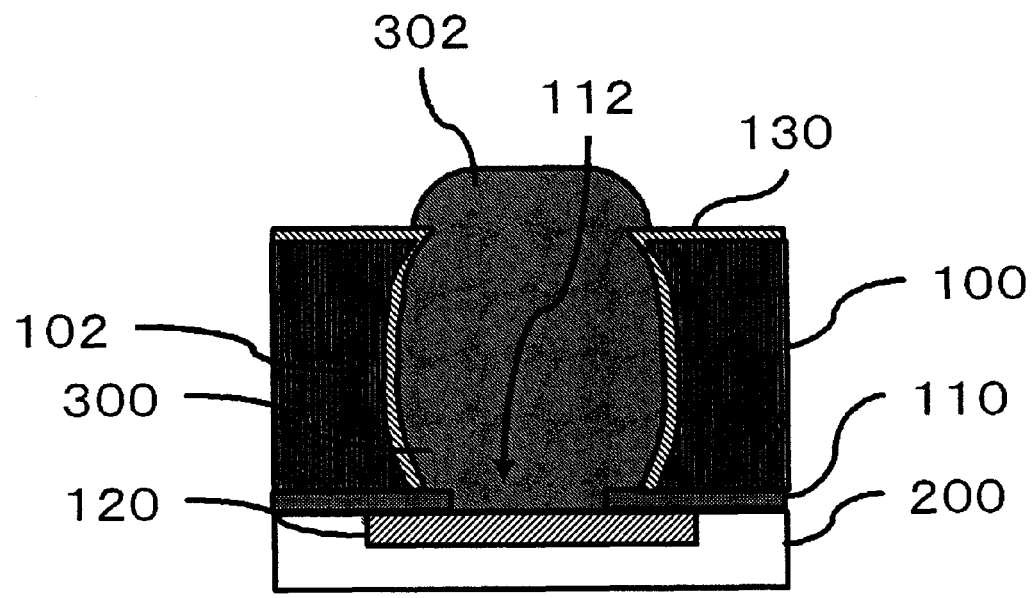

FIGS. 5A and 5B are cross-sectional views illustrating a method of manufacturing a semiconductor device according to a second embodiment. This method of manufacturing a semiconductor device has the same constitution as the method of manufacturing a semiconductor device shown in the first embodiment except for the shape of the through-hole 102. Here, FIG. 5A shows the state of FIG. 2B in the first embodiment, and FIG. 5B shows the state of FIG. 1 in the first embodiment.

In the present embodiment, the through-hole 102 and the through-electrode 300 have a part in which the distance from the central axis to the circumference is larger than that of the upper end, and the part is other than the upper end. Specifically, the through-hole 102 has a bowing shape, where the distance from the central axis to the circumference is small at the upper end and at the bottom surface, and this distance becomes gradually larger as it goes towards the approximately central part in the height direction.

Such a shape can be formed by adjusting the dry etching condition at the time of forming the through-hole 102 so as to reduce the straight progression property of the ions and to improve the scattering property of the ions so that the etching may proceed both in the in-plane direction and in the thickness direction of the substrate 100. Specifically, the vacuum degree at the time of dry etching is reduced, the temperature of the substrate 100 is raised, and the other etching conditions are suitably adjusted.

According to the present embodiment, effects similar to those of the first embodiment can be produced. Also, the through-hole 102 and the through-electrode 300 have a part in which the distance from the central axis to the circumference is larger than that of the upper end, in the part other than the upper end. So the through-electrode 300 and the bump 302 can be prevented from slipping out from the substrate 100. Also, the control of the etching conditions is easier than in the case in which the shape of the through-hole 102 is made to be a straight shape.

Also, in the through-hole 102, when the distance from the central axis to the circumference at the upper end is smaller than the distance at the bottom surface, the opening pattern 112 may be formed in a self-aligned manner using the upper end of the through-hole 102 as a mask in the etching for forming the opening pattern 112. In this case, there will be no need to use a mask pattern in forming the opening pattern 112.

Figure 6:
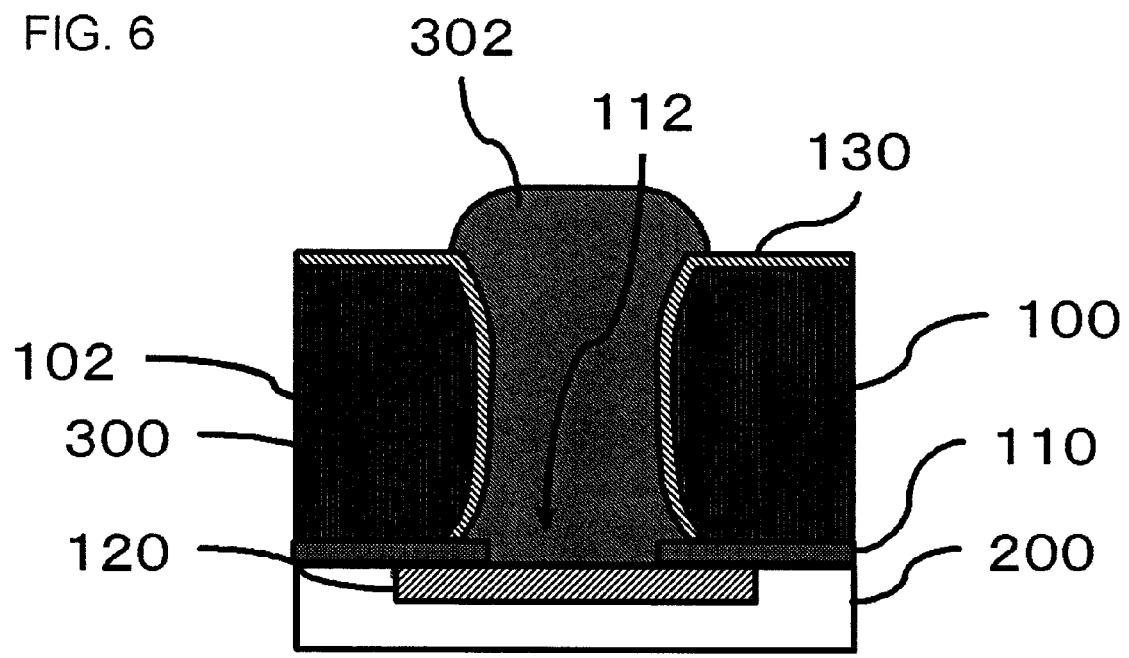
FIG. 6 is a cross-sectional view illustrating a modification of the second embodiment.

Here, as shown in FIG. 6, the through-hole 102 may have such a shape that the distance from the central axis to the circumference is larger at the upper end and at the bottom surface, and the distance gradually becomes smaller as it goes towards the approximately central part in the height direction. In this case also, the above-described effects can be produced.

Third Embodiment

Figure 7A:
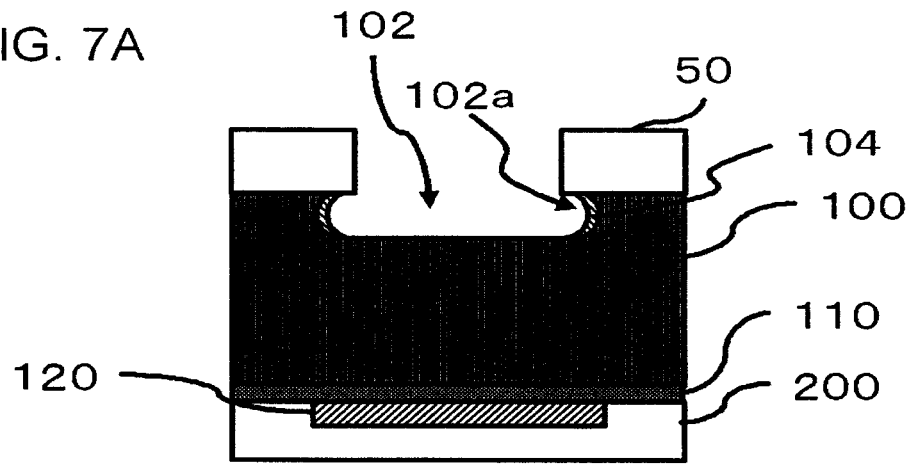
FIGS. 7A to 7C are cross-sectional views illustrating a method of manufacturing a semiconductor device according to a third embodiment.
Figure 7B:
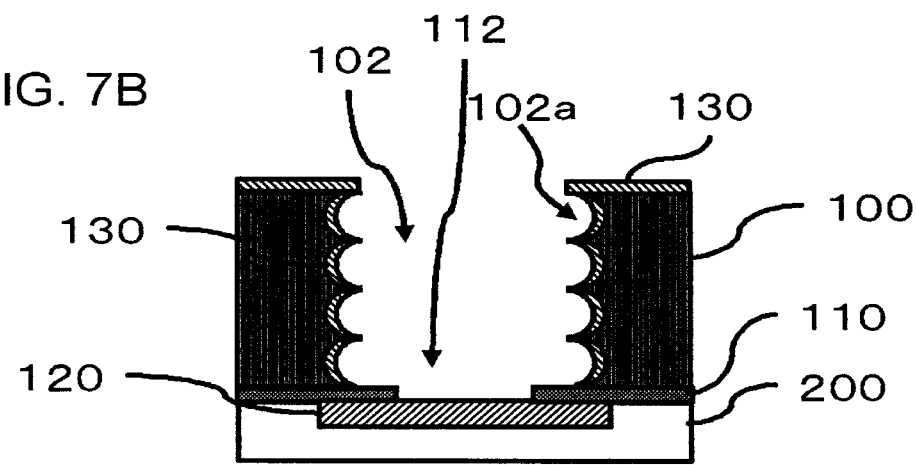
Figure 7C:
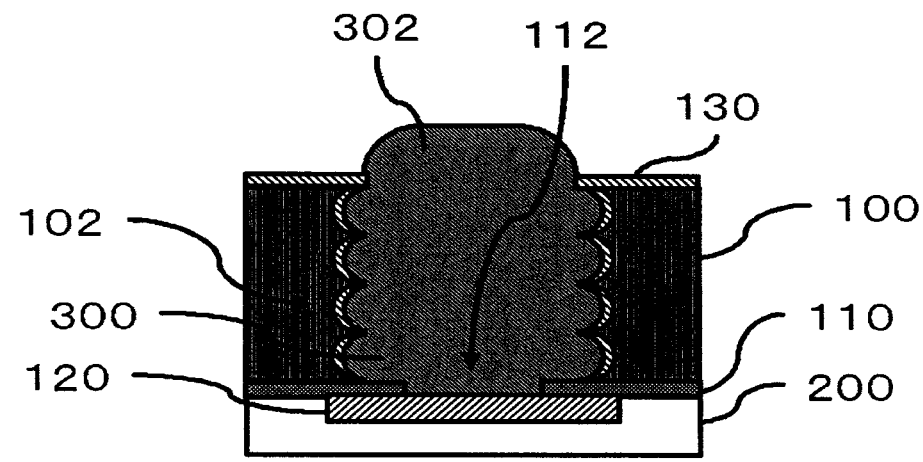

FIGS. 7A to 7C are cross-sectional views illustrating a method of manufacturing a semiconductor device according to a third embodiment. This method of manufacturing a semiconductor device is the same as the method of manufacturing a semiconductor device according to the first embodiment except for the shape of the through-hole 102 and the method of forming the through-hole 102. Here, FIGS. 7A and 7B show a method of forming the through-hole 102, and FIG. 7C shows the state of FIG. 4C in the first embodiment.

In the present embodiment, the through-hole 102 has what is known as a scallop shape, and has a plurality of grooves 102a which go all around in the circumferential direction of the through-hole 102 and arranged in the up-and-down direction on the inner wall. In the cross-sectional view containing the central axis of the through-hole 102, the shape of the side surface of each groove 102a is a shape that goes along a circular arc.

In the present embodiment, the through-hole 102 can be formed by what is known as the Bosch method. Specifically, as shown in FIG. 7A, first a mask pattern 50 is formed on the back surface of the substrate 100. Subsequently, the substrate 100 is etched using the mask pattern 50 as a mask. This forms a part of the through-hole 102 and an uppermost groove 102a. Subsequently, a protective film 104 that covers the uppermost groove 102a is formed. The protective film 104 is, for example, made of fluoride, and can be formed by using a halogen gas of fluoride series. Thereafter, the etching using the mask pattern 50 as a mask and the forming of the protective film 104 are repeated until the insulating layer 110 is exposed at the bottom of the through-hole 102.

Thereafter, as shown in FIG. 7B, the protective film 104 is removed by washing. Thereafter, the opening 112 and the insulating film 130 are formed. The method of forming them is the same as that of the first embodiment.

Thereafter, as shown in FIG. 7C, the through-electrode 300 and the bump 302 are formed. The method of forming them is the same as that of the first embodiment.

According to the present embodiment, effects similar to those of the first embodiment can be produced. Also, since the inner wall of the through-hole 102 and the side surface of the through-electrode 300 have a scallop shape, the through-electrode 300 can be prevented from slipping out from the through-hole 102. Also, the control of the etching conditions will be easier than in the case in which the shape of the through-hole 102 is made to be a straight shape.

Fourth Embodiment

Figure 8A:
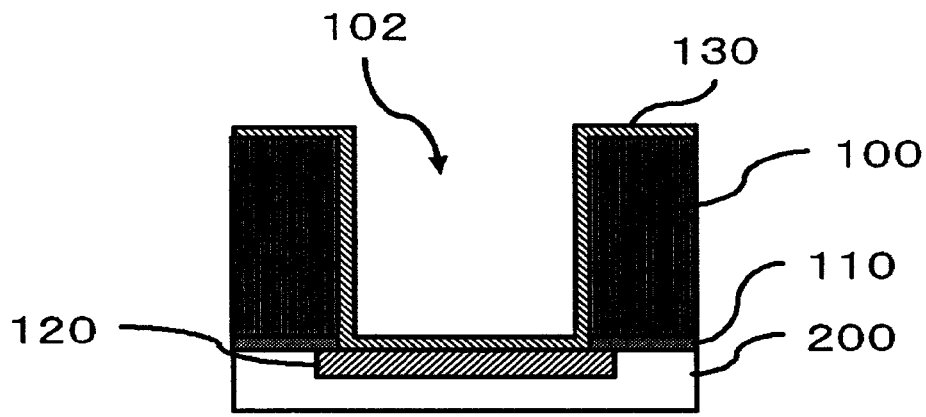
FIGS. 8A to 8C are cross-sectional views illustrating a method of manufacturing a semiconductor device according to a fourth embodiment.
Figure 8B:
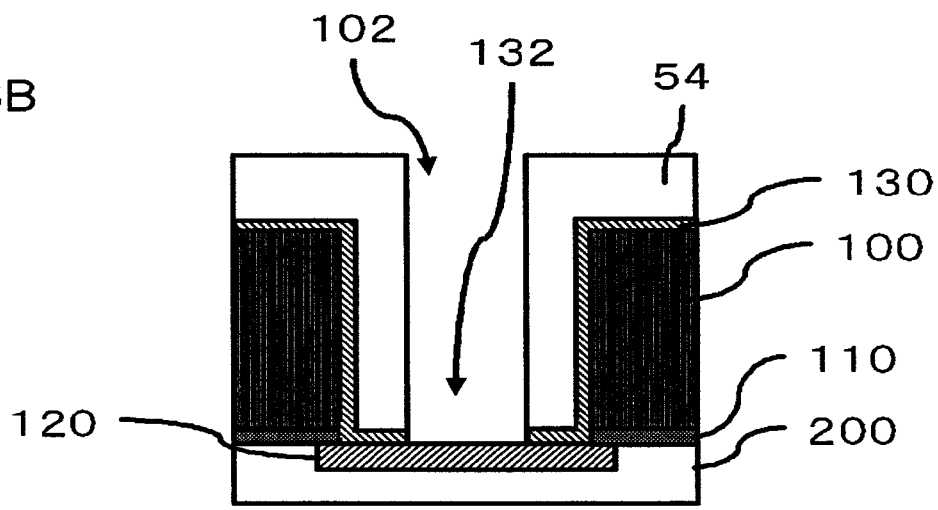
Figure 8C:
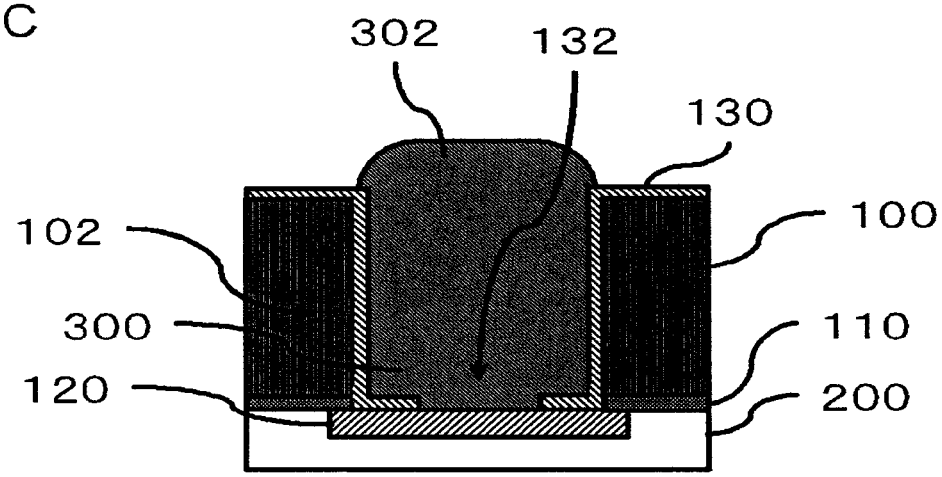

FIGS. 8A to 8C are cross-sectional views illustrating a method of manufacturing a semiconductor device according to a fourth embodiment. This method of manufacturing a semiconductor device is the same as the method of manufacturing a semiconductor device according to the first embodiment except that the opening pattern 132 formed in the insulating film 130 is used instead of the opening pattern 112. Hereafter, description of the same steps as those of the first embodiment will not be repeated.

First, as shown in FIG. 8A, a through-hole 102 is formed in the substrate 100. At this time, the through-hole 102 penetrates also through the insulating layer 110. In this state, the conductive pattern 120 is exposed at the bottom surface of the through-hole 102. Subsequently, an insulating film 130 is formed on the side surface and the bottom surface of the through-hole 102 and the back surface of the substrate 100. The method of forming the insulating film 130 is the same as that of the first embodiment.

Subsequently, as shown in FIG. 8B, a mask pattern 54 is formed on the insulating film 130, and an etching treatment is carried out using the mask pattern 54 as a mask. By this process, an opening pattern 132 is formed in the insulating film 130. The shape of the opening pattern 132 is the same as the shape of the opening pattern 112 in the first embodiment.

Thereafter, as shown in FIG. 8C, the mask pattern 54 is removed. Next, a through-electrode 300 and a bump 302 are formed.

According to the present embodiment also, effects similar to those of the first embodiment can be produced. Also, the opening pattern 132 is formed instead of forming the opening pattern 112 in the insulating layer 110. Here, the step of forming the opening pattern 132 is carried out instead of the step of removing the insulating film 130 that is located at the bottom surface of the through-hole 102 in the first embodiment. So the number of manufacturing steps is reduced.

Fifth Embodiment

Figure 9A:
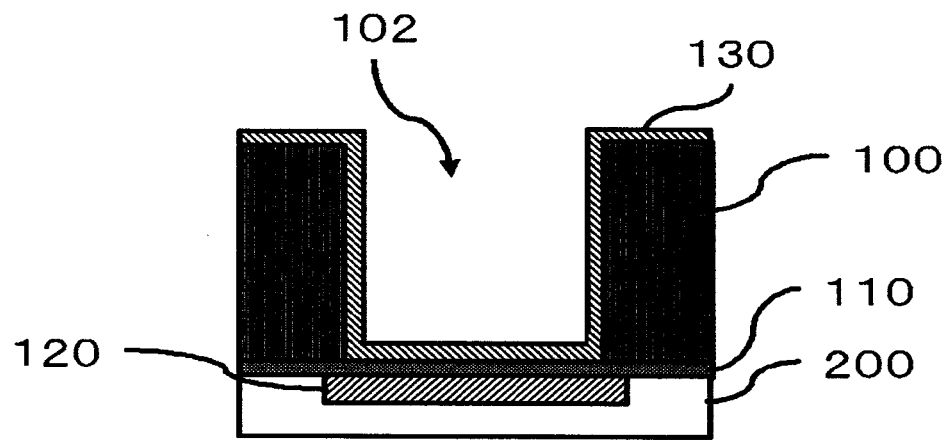
FIGS. 9A to 9C are cross-sectional views illustrating a method of manufacturing a semiconductor device according to a fifth embodiment.
Figure 9B:
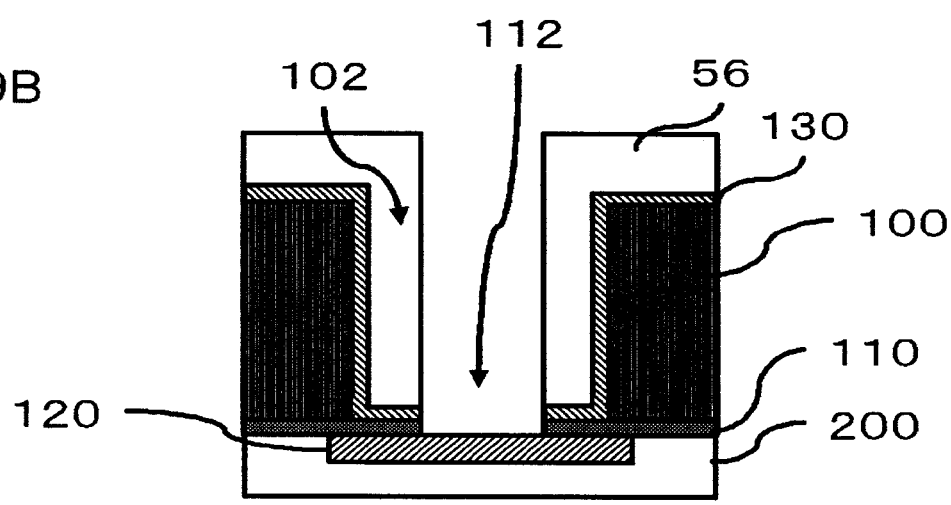
Figure 9C:
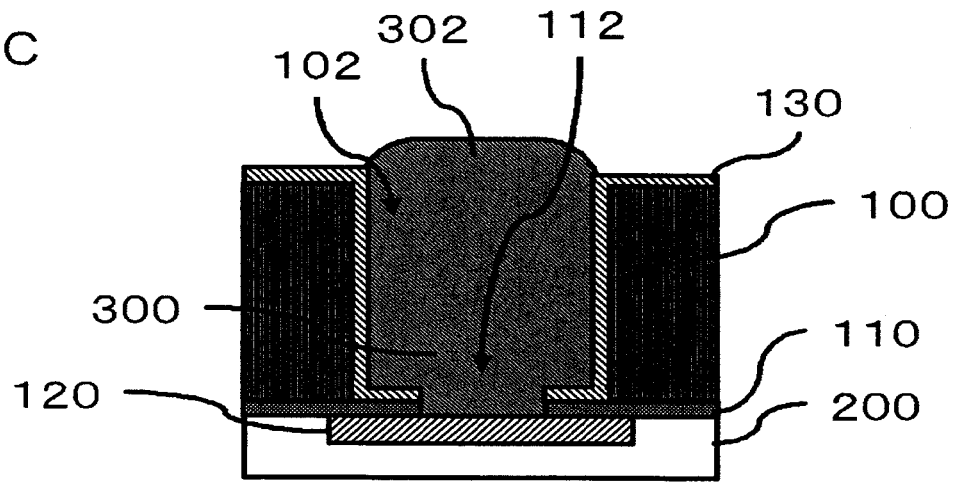

FIGS. 9A to 9C are cross-sectional views illustrating a method of manufacturing a semiconductor device according to a fifth embodiment. This method of manufacturing a semiconductor device is the same as the method of manufacturing a semiconductor device according to the first embodiment except for the timing of forming the opening pattern 112. Hereafter, description of the same steps as those of the first embodiment will not be repeated.

First, as shown in FIG. 9A, a through-hole 102 is formed in the substrate 100 so as to expose the insulating layer 110 at the bottom surface of the through-hole 102. Subsequently, an insulating film 130 is formed on the side surface of the through-hole 102, on the insulating layer 110 that is located at the bottom surface of the through-hole 102, and on the back surface of the substrate 100. The method of forming the insulating film 130 is the same as that of the first embodiment.

Subsequently, as shown in FIG. 9B, a mask pattern 56 is formed on the insulating film 130, and an etching treatment is carried out using the mask pattern 56 as a mask. By this process, an opening pattern 112 is formed in the insulating films 130 and 110.

Thereafter, as shown in FIG. 9C, the mask pattern 56 is removed. Next, a through-electrode 300 and a bump 302 are formed.

According to the present embodiment also, effects similar to those of the first embodiment can be produced. Also, after the insulating film 130 is formed, the opening pattern 112 is formed so as to penetrate through the insulating films 130 and 110. Therefore, there is no need of providing another step of removing the insulating film 130 that is located at the bottom surface of the through-hole 102. So the number of manufacturing steps is reduced.

Sixth Embodiment

Figure 10:
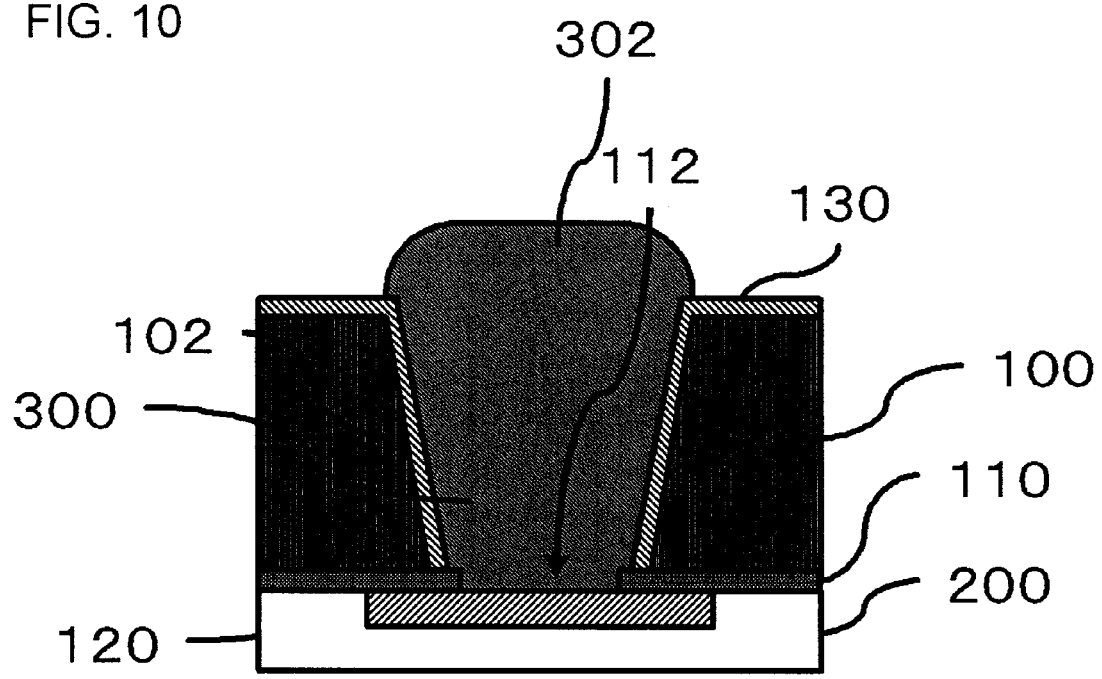
FIG. 10 is a cross-sectional view illustrating a semiconductor device according to a sixth embodiment.

FIG. 10 is a cross-sectional view illustrating a semiconductor device according to a sixth embodiment. This semiconductor device is the same as that of the first embodiment except that the through-hole 102 has a tapered shape and that the distance from the central axis to the circumference becomes larger as it approaches the upper end. The method of manufacturing this semiconductor device also is the same as that of the first embodiment except that the etching conditions for forming the through-hole 102 are adjusted so as to allow the through-hole 102 to have a tapered shape.

According to the present embodiment, effects similar 680 to those of the first embodiment can be produced. Also, the control of the etching conditions will be easier than in the case in which the shape of the through-hole 102 is made to be a straight shape.

Seventh Embodiment

Figure 11:
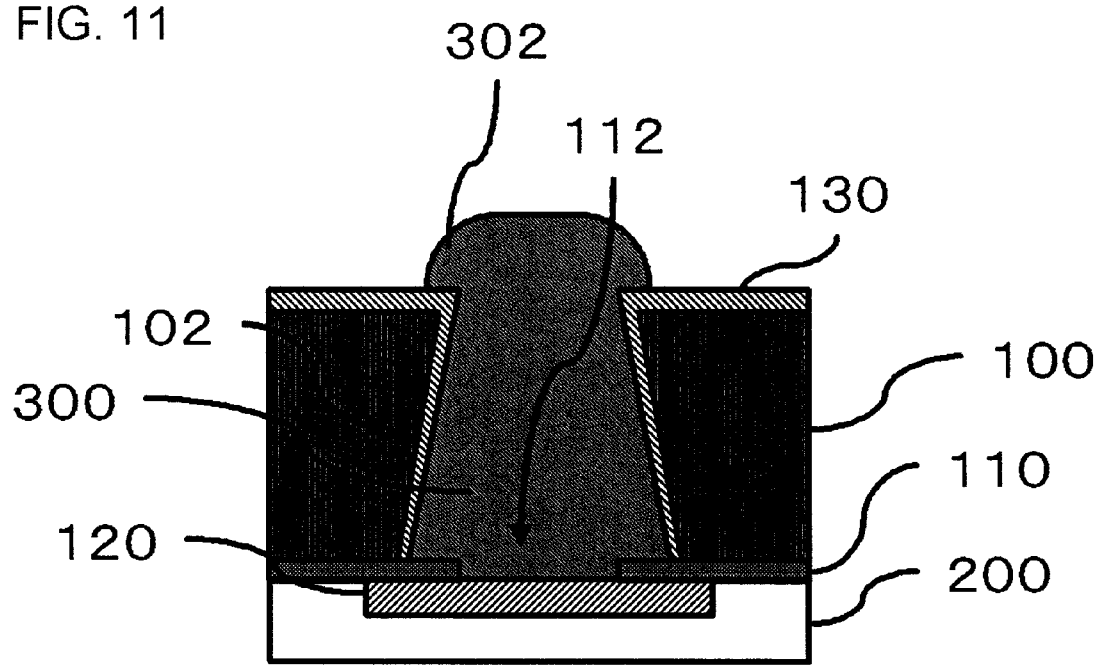
FIG. 11 is a cross-sectional view illustrating a semiconductor device according to a seventh embodiment.

FIG. 11 is a cross-sectional view illustrating a semiconductor device according to a seventh embodiment. This semiconductor device is the same as that of the first embodiment except that the through-hole 102 has an inverse tapered shape and that the distance from the central axis to the circumference becomes smaller as it approaches the upper end. The method of manufacturing this semiconductor device is also the same as that of the first embodiment except that the etching conditions for forming the through-hole 102 are adjusted so as to allow the through-hole 102 to have an inverse tapered shape.

According to the present embodiment, effects similar to those of the first embodiment can be produced. Also, the control of the etching conditions will be easier than in the case in which the shape of the through-hole 102 is made to be a straight shape.

As described above, the embodiments of the present invention have been described with reference to the attached drawings. However, these are exemplifications of the present invention, and one can adopt various configurations other than those described above.

For example, the planar shape of the through-hole 102 is not limited to a circular shape, and may be, for example, a polygonal shape such as a quadrangular shape or an octagonal shape. The same applies to the shape of the opening patterns 112 and 132.

Each of the above-described semiconductor devices may include a plurality of through-electrodes 300 within one and the same substrate 100. The semiconductor device has an insulating layer 130 on the side surface of the through-electrode 102 and on the surface opposite to the one surface of the substrate 100. Therefore, even if a plurality of through-electrodes 300 are provided within one and the same substrate 100, the plurality of through-electrodes 300 can be electrically insulated from each other.

It is apparent that the present invention is not limited to the above embodiments, and may be modified and changed without departing from the scope and spirit of the invention.

What is claimed is:

1. A semiconductor device comprising:
   a substrate, the substrate comprising a first surface and a second surface, the second surface is another side of the first surface;
   a conductive pattern located on the first surface side of the substrate;
   a through-hole formed in the substrate and located over the conductive pattern;
   an insulating layer located at a bottom surface of the through-hole, the bottom surface is located on the first surface side;
   an opening pattern formed in the insulating layer, a width of the opening pattern is smaller than a width of a bottom of the through-hole, and the conductive pattern is exposed to the bottom surface of the through-hole;
   a through-electrode formed in the opening pattern and in the through-hole, so as to be connected to the conductive pattern; and
   a bump located on the second surface and formed integrally with the through-electrode.

2. The semiconductor device according to claim 1, wherein the insulating layer is formed on the first surface and the conductive pattern is formed on the insulating layer.

3. The semiconductor device according to claim 1, wherein the insulating layer is a first insulating layer;
   the semiconductor device further comprises a second insulating layer; and
   the second insulating layer is formed on the second surface and on a side surface of the through-hole.

4. The semiconductor device according to claim 1, wherein a difference between the distance from the circumference of the opening pattern to the central axis of the through-hole and the distance from the circumference of the through-hole to the central axis of the through-hole is 1 μm or more and 3 μm or less.

5. The semiconductor device according to claim 1, wherein the following formula is satisfied:

$$(r_2 - r_1 = (h - (r_1 - r_3)) \times (1 \pm 0.3), \text{ where:}$$

$r_1$ is a distance from a circumference of the through-electrode to a central axis of the through-hole;
   $r_2$ is a distance from a circumference of a bottom surface of the bump to the central axis of the through-hole;
   $r_3$ is the distance from the circumference of the opening pattern to the central axis of the through-hole; and
   $h$ is a height of the bump.

6. The semiconductor device according to claim 1, wherein the through-hole has a part which is located at a place other than an upper end thereof and whose distance from a central axis to a circumference is larger than that of the upper end.

7. The semiconductor device according to claim 1, wherein the through-hole has a part which is located at a place other than a bottom surface thereof and whose distance from a central axis to a circumference is smaller than that of the bottom surface.

8. The semiconductor device according to claim 1, wherein an inner wall of the through-hole has a plurality of grooves that go all around along a circumferential direction of the through-hole.

9. The semiconductor device according to claim 1, wherein a distance from a central axis of the through-hole to a circumference of the through-hole becomes larger as it approaches an end located on the second surface side.

10. The semiconductor device according to claim 1, wherein a distance from a central axis of the through-hole to a circumference of the through-hole becomes smaller as it approaches an end located on the second surface side.

* * * * *